US010784858B2

(12) United States Patent
Lecce et al.

(10) Patent No.: US 10,784,858 B2
(45) Date of Patent: Sep. 22, 2020

(54) DRIVER CIRCUIT, CORRESPONDING SYSTEM AND METHOD

(71) Applicants: STMicroelectronics (Grenoble 2) SAS, Grenoble (FR); STMicroelectronics S.r.l., Agrate Brianza (MB) (IT)

(72) Inventors: Sergio Lecce, Pavia (IT); Gilles Troussel, Grenoble (FR)

(73) Assignees: STMICROELECTRONICS S.R.L., Agrate Brianza (IT); STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 16/249,065

(22) Filed: Jan. 16, 2019

(65) Prior Publication Data

US 2019/0229726 A1 Jul. 25, 2019

(30) Foreign Application Priority Data

Jan. 23, 2018 (IT) .......................... 102018000001660

(51) Int. Cl.
| | | |
|---|---|---|
| *H03K 17/687* | (2006.01) | |
| *H03K 19/0185* | (2006.01) | |
| *H03K 17/10* | (2006.01) | |
| *H03K 17/0814* | (2006.01) | |
| *G05F 3/26* | (2006.01) | |
| *G06F 13/20* | (2006.01) | |
| *H04L 12/40* | (2006.01) | |

(52) U.S. Cl.
CPC ......... *H03K 17/6871* (2013.01); *G05F 3/262* (2013.01); *G06F 13/20* (2013.01); *H03K 17/08142* (2013.01); *H03K 17/102* (2013.01); *H03K 19/018557* (2013.01); *H04L 12/40013* (2013.01)

(58) Field of Classification Search
CPC .................................................. H03G 1/0029
See application file for complete search history.

(56) References Cited

U.S. PATENT DOCUMENTS

| | | | | | |
|---|---|---|---|---|---|
| 5,153,453 | A | * | 10/1992 | Walters ..................... | G05F 3/18 327/502 |
| 7,183,793 | B2 | * | 2/2007 | Jordanger ........ | H03K 19/00346 326/26 |
| 2003/0122594 | A1 | * | 7/2003 | Tada .................... | H03K 17/687 327/108 |

FOREIGN PATENT DOCUMENTS

| | | |
|---|---|---|
| DE | 10240167 A1 | 3/2004 |
| EP | 3208940 A1 | 8/2017 |

* cited by examiner

*Primary Examiner* — Henry Tsai
*Assistant Examiner* — Juanito Borromeo
(74) *Attorney, Agent, or Firm* — Slater Matsil, LLP

(57) ABSTRACT

A driver circuit includes a supply node, a control node configured to receive a control signal, and an output node. An output transistor is coupled to the output node to provide the CAN bus drive signal via the current path through the output transistor. A current mirror is in a current line from the supply node to the output node through the output transistor. The current line includes an intermediate portion between the current mirror and the output transistor. The current mirror is configured to be switched, as a function of the control signal between a first, dominant mode, with the CAN bus drive signal applied to the output node via the output transistor, and a second, recessive mode, with the output transistor providing a high output impedance at the output node.

23 Claims, 7 Drawing Sheets

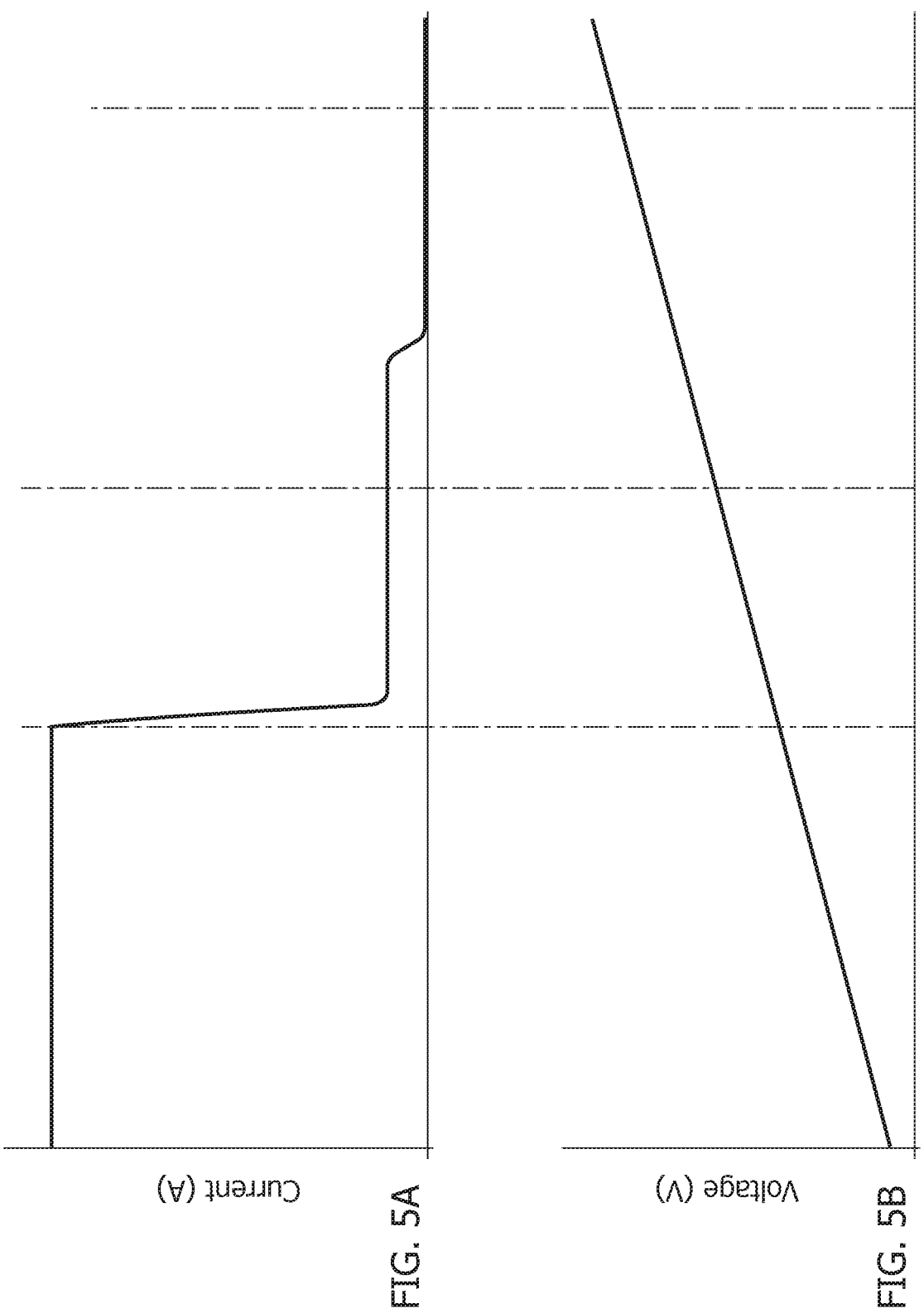

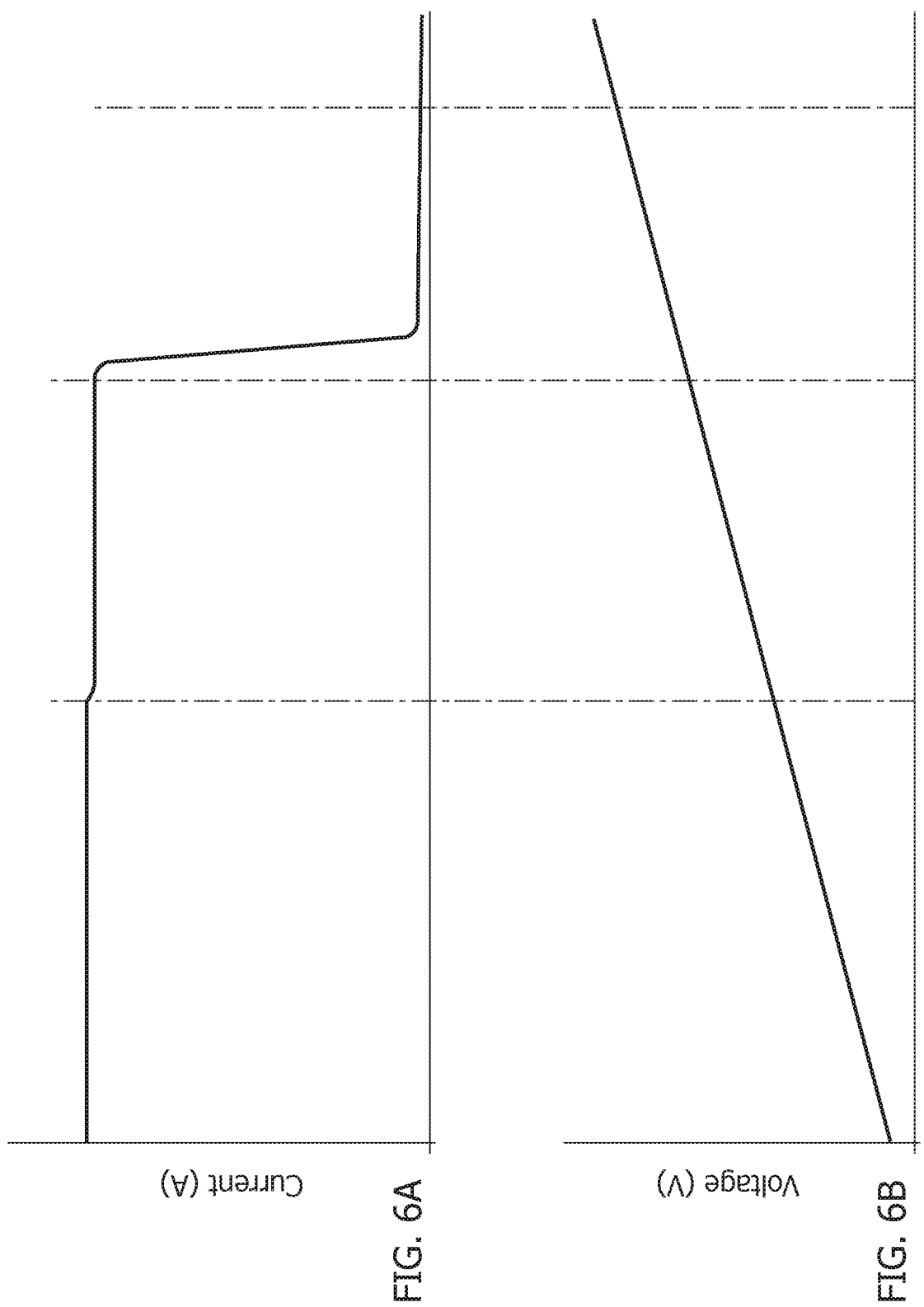

DRIVER CIRCUIT, CORRESPONDING SYSTEM AND METHOD

CROSS-REFERENCE TO RELATED APPLICATIONS

This application claims priority to Italian Patent Application No. 102018000001660, filed on Jan. 23, 2018, which application is hereby incorporated herein by reference.

TECHNICAL FIELD

The description relates to driver circuits.

BACKGROUND

International standards dealing with CAN applications (e.g. CAN-HS and CAN-FD transceivers, that is physical layers) such as ISO11898-2, following ISO16845-2 Conformance Test Plan are continuously evolving.

Developments involve improvements and new features, such as flexible data-rate (CAN-FD) and increasing robustness constraints for the physical layer.

For instance, standards such as ISO11898-2 establish certain requirements on the Rin resistance by dictating specifications for values of Rin and their matching, e.g. high-side (CANH) v. low-side (CANL).

However, no measurement method is provided for the input resistance and no validity ranges are stipulated for CANH/CANL voltages for determining Rin requirements.

Standard ISO16845-2 (2015 version) provides certain test specifications for the resistance Rin. For instance Rin measurements are specified with respect to a 5V (external) test voltage generator and series 10 kOhm test resistor.

With such a measurement set up, the CANH voltage is not expected to exceed 4.6 V in the active mode (when the Rin value lies within the specified range). Also, the CANH pin voltage is not expected to exceed the VDD_CAN supply voltage.

Standard ISO16845-2 (2017 version) again provides certain test specifications for the resistance Rin without however fully describing a corresponding measurement setup. Also, the Rin resistance is specified in a −2V to +7V pin voltage range. According to these new specifications, the CANH pin voltage can exceed the VDD_CAN supply voltage.

In general terms (that is, without taking into account technology limitations) CANH/L driver topologies can be driven following Absolute Maximum Ratings (AMR) requirements, that is in a voltage range between −27V and +40V.

To that effect, a CANL driver may comprise a cascoded current generator, capable of withstanding +40V and limiting the output current and the dominant voltage in the case of short circuit, with a series high-voltage (HV) diode capable of withstanding short-circuits conditions to −27V.

A corresponding (ideal) CANH driver may in turn comprise a cascoded current generator, capable of withstanding −27V and limiting the output current and a dominant voltage in the case of short circuit, with a series HV diode capable of withstanding short-circuit conditions to +40V.

A CAN transceiver can be integrated in an automotive System-Basis Chip (SBC) by representing e.g. a commodity function with a silicon area weight under 5% of the total device area.

Automotive SBC'S may be integrated using low-cost 40V technology (such as Bipolar-CMOS-DMOS technology) with certain possible limitations related e.g. to the unavailability of a HV diode with a cathode terminal capable of floating down to −27V.

It is observed that such a technological limitation could be overcome by resorting to more expensive technological options, such as Silicon-On-Insulator (SOI) or double-epitaxy/double-buried-layer technologies).

It is similarly observed that such an approach would have a negative impact on SBC costs, such an impact being hardly justified by such a relatively small function.

These factors may lead to certain design trade-offs eventually resulting in CANH driver topologies that are not symmetrical to the associated CANL driver topologies as desirable: e.g., input characteristics (both static and dynamic) of a CANH driver may change appreciably according to whether the driver is disabled or enabled, e.g., in the recessive mode (or state), which is not the case for a homologous CANL driver.

SUMMARY

One or more embodiments may be applied in CAN (Controlled Area Network) bus arrangements for use, e.g., in the automotive sector.

One or more embodiments can contribute in overcoming the limitations discussed in the foregoing.

One or more embodiments may relate to a corresponding device (e.g. a CAN bus driver, for use in the automotive sector). One or more embodiments may relate to a corresponding method. The claims are an integral part of the technical disclosure of embodiments as provided herein.

One or more embodiments make it possible to implement CAN drivers capable of avoiding current flow through their output line when in the recessive mode or state (CANTX=1).

One or more embodiments may be implemented by using low-cost BCD technology.

One or more embodiments facilitate simplified and robust implementations meeting with input resistance specifications as set forth, e.g. in the ISO11898-2 standard in a pin voltage range up to +7V or wider, such as −12V to +12V (this being a likely future requirements in ISO16845-2 test specifications). In this document, reference to a standard is meant to be a reference to all versions of the standard effective as of the effective filing date of this patent.

One or more embodiments make it possible to achieve appreciable advantages in terms of cost saving.

One or more embodiments facilitate providing a driver topology using basic components available as low-cost technological options while providing benefits (e.g. in terms of electrical parameters) currently available only by resorting to relatively expensive components.

One or more embodiments make it possible to achieve the advantages outlined in the foregoing without resorting to sophisticated technology options for integrating a fully-floating HV-diode.

One or more embodiments may provide a novel CANH driver topology providing an (arbitrarily) low input current in a recessive mode.

One or more embodiments may facilitate meeting ISO11898-2 absolute maximum rating requirements for 12V-systems (−27V to +40V), without resorting to a high-voltage diode (40V mean) capable of floating down to −27V.

One or more embodiments facilitate providing satisfactory EMC (Electro Magnetic Compatibility) performance both in terms of emissions and in terms of RF immunity.

Possible use of one or more embodiments can be detected, e.g. by measurements at device pins, e.g. by measuring an I-V characteristic of a CANH pin in the recessive mode (REC) and in the dominant mode (DOM) and analyzing if a different behavior can be traced versus frequency of the applied stimulus.

BRIEF DESCRIPTION OF THE DRAWINGS

One or more embodiments will now be described, by way of example only, with reference to the annexed figures, wherein:

FIGS. 5A, 5B, 6A, 6B, 7A and 7B are exemplary of various modes of operation applicable in CANH driver topologies.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
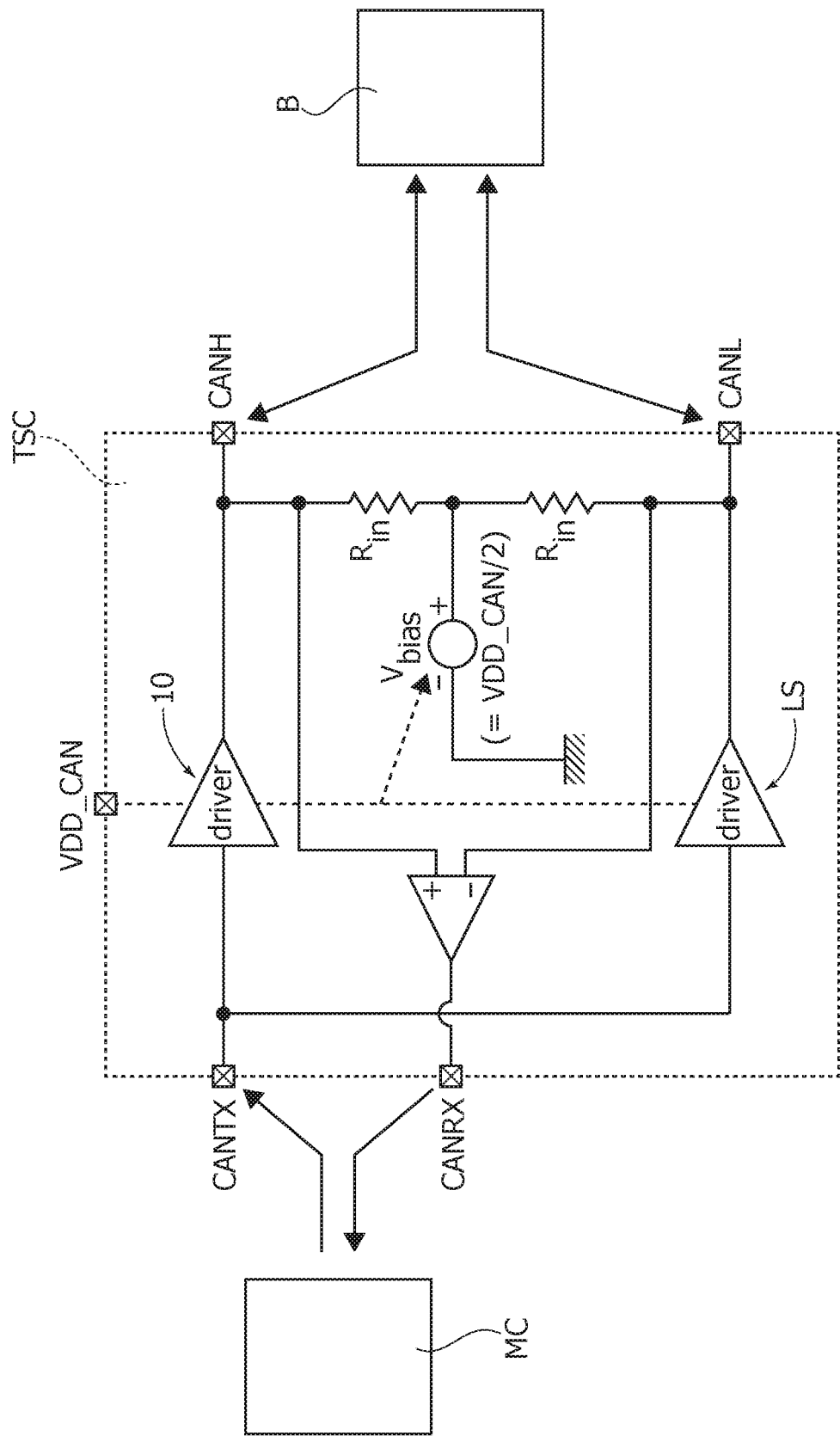
FIG. 1 is exemplary of a CAN bus driver arrangement.

A CAN transceiver TSC as exemplified in FIG. 1 can provide three main functions:

biasing (involving input resistors $R_{in}$ and an associated bias generator $V_{bias}$) of an associated bus B coupled to CANH and CANL nodes for the "high" and "low" sides of the bus, respectively, receiver operation, e.g. by means of a comparator on bus differential voltage (CANH-CANL) coupled to a receiver node CANRX, transmitter operation e.g. driving CANH and CANL via a high-side driver 10 and a low-side driver LS, respectively, as a function of signals applied to a transmitter node CANTX.

Such a transceiver TSC may be intended to be supplied with a supply (rail) voltage VDD_CAN, e.g. at 5V (nominal value) and to operate under the control of a microcontroller MC coupled to the nodes CANTX and CANRX.

Operation of the transmitter in such a transceiver TSC may involve driving e.g. 2V (nominal) differential voltage on the bus B when transmitter operation is enabled, e.g., by a voltage CANTX=0 applied to the input node CANTX in a dominant mode or state ("DOM").

Such a transmitter should desirably provide a high-impedance value for the CAN bus lines when, e.g. a voltage CANTX=1 is applied to the input node CANTX in a so-called recessive mode or state ("REC"). In the recessive mode the bus lines are coupled to the biasing structure ($R_{in}$, $V_{bias}$) and "see" a $R_{in}$ impedance set e.g. to 35 kohm (nominal).

The overall structure and mode of operation of a CAN transceiver TSC as exemplified in FIG. 1 are otherwise conventional in the art, thus making it unnecessary to provide a more detailed description herein.

Figure 2:
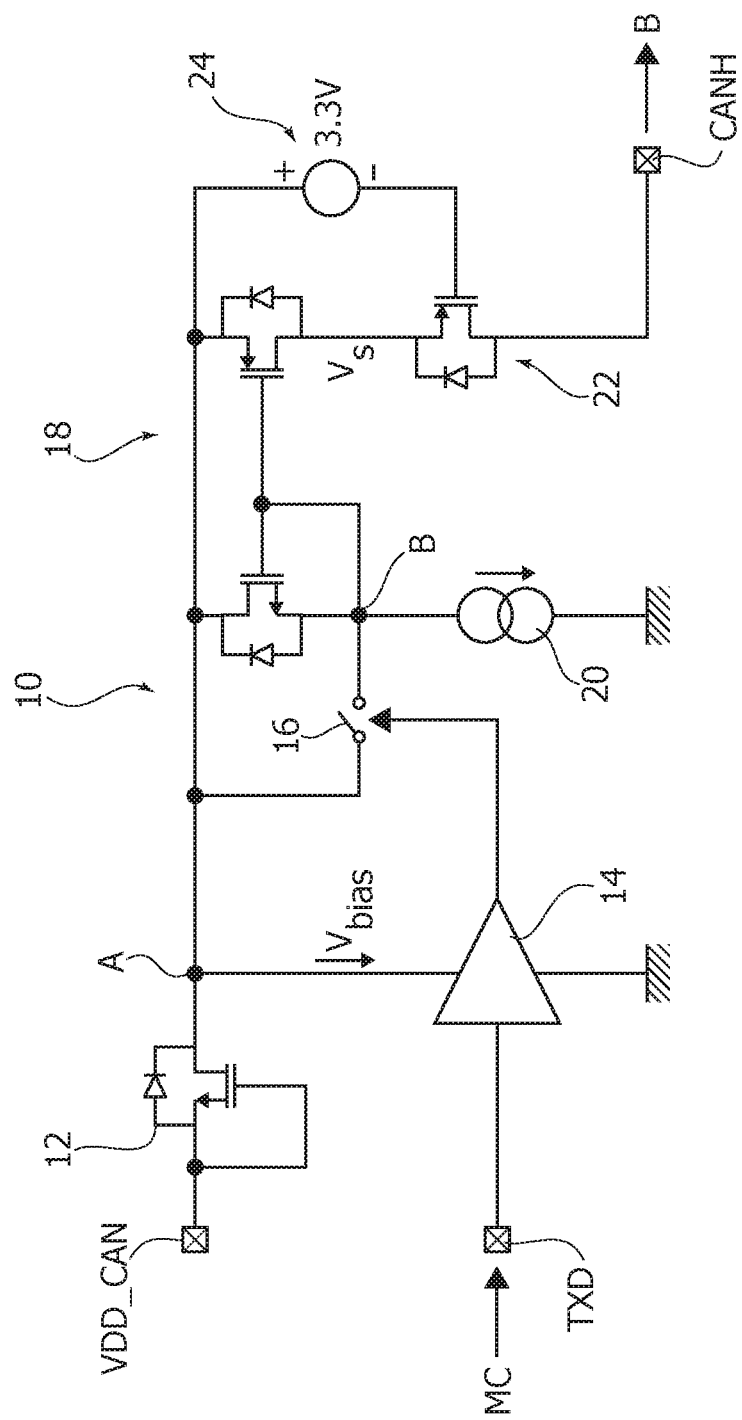
FIG. 2 is a circuit diagram of a CANH driver topology.

FIG. 2 is a circuit diagram of a CANH driver topology (e.g. 10 in the diagram of FIG. 1) suited for use with Bipolar-CMOS-DMOS (BCD) designs.

In the arrangement exemplified in FIG. 2, the CANH driver 10 (hereinafter, "the driver" for brevity) is supplied via a supply node with a supply voltage VDD_CAN (e.g. 5V nominal) and is configured to provide at an output node CANH a drive signal for the high side of a CAN bus (see e.g., B FIG. 1) as a function of a control signal applied at a control node TXD (which may correspond to node CANTX in FIG. 1) e.g. via a microcontroller such as MC in FIG. 1.

In the diagram of FIG. 2, reference 12 indicates a diode (obtained e.g. by means of a transistor such as a MOS transistor in a diode arrangement, that is with gate shorted to the source) which provides a voltage VDD_CAN–$V_{diode}$ (where $V_{diode}$ denotes the voltage drop across the diode 12) at a supply node A. The node A provides a bias current $I_{bias}$ to a driver stage 14 which receives the signal at the node TXD in order to control a switch 16 (e.g. an electronic switch such as a transistor) configured to selectively couple the node A with a node B between a current mirror 18 (e.g. a 1:100 3.3V P-ch current mirror) and a current generator 20 (e.g. 720 µA) active between the node B and ground.

It will be appreciated that the representation provided herein, including the driver stage 14 and the switch 16, is a simplified representation—given herein merely for the sake of simplicity and ease of explanation—of how activation of the current mirror 18 can be controlled.

Real arrangements adopted for controlling the turn-on/turn-off of the output current depending on the TXD (digital) input signal may in fact be more complex: these arrangements are otherwise well known to the skilled in the art, thus making it unnecessary to provide a more detailed description herein.

Reference 22 denotes a transistor (e.g., a 45V P-dex MOSFET with buried-layer) arranged with its current path (source-drain) cascaded (in series) between the current path through the output transistor of the current mirror 18 and the output node CANH.

In that way, the cascaded arrangement of the output transistor in the current mirror 18 and the transistor 22 (with an intermediate point therebetween at a voltage Vs) is arranged between a floating supply rail as defined by the node A (intended to be brought to a voltage $V_{high}$) and the output node CANH.

By way of explanation, the circuit diagram of FIG. 2 also comprises the representation of a voltage generator 24 (e.g. 3.3V) arranged between the floating supply rail and the gate of the transistor 22 (intended to be brought to a voltage $V_{low}=V_{high}-3.3V$). Such a representation is merely for the sake of explanation: in real implementations the current for generating $V_{low}=V_{high}-3.3V$ can be directly comprised (accounted for) in the bias current $I_{bias}$ to the driver 14.

The switch 16 is exemplary of the possibility (discussed previously) for a circuit as exemplified in FIG. 2 to be switched between a dominant mode (DOM) when the input node TXD is brought to a first value, e.g. CANTX=0 and a recessive mode (REC) when the input node TXD is brought to a second value, e.g. CANTX=1.

It is observed that in an arrangement as exemplified in FIG. 2, during transitions between the DOM and REC modes (DOM←→REC) the gate voltage generator for the transistor 22 should expectably be able to sink/source currents up to e.g. 1.6 mA (with limited voltage variations) in order not to compromise electromagnetic emission (EME) performance, even in the presence of falling/rising edges as short as 20 ns (which may be the case for AB class output stages used to drive the gate of the transistor 22 e.g. with 450 μA quiescent current.

As noted previously, in an arrangement as exemplified in FIG. 2 the voltage $V_{low}$ is set to a fixed (gate) voltage equal to $V_{high}$–3.3V.

It is observed that, in an arrangement as exemplified in FIG. 2 in the recessive mode (REC) with the pin voltage driven above VDD_CAN (e.g. 5V), an input current may be sunk by the driver which may compromise CANH input resistance measurement. The ISO16845-2 standard published on Jan. 31, 2017 specifies input resistance test conditions with a CANX pins from –2V to 7V.

It is observed that a topology as exemplified in FIG. 2 may fail to meet such requirements.

As noted, such a problem could be addressed by resorting to technology options permitting to integrate a fully-floating HV diode (e.g. 40V breakdown minimum, capable of floating at least down to –27V): stand-alone CAN transceivers are in fact available which use SOI (Silicon On Insulator) technology.

A standard junction-isolation BCD technology (having a lower cost, and thus widely accepted for integrating automotive system-basis-chips) might also be considered; this would however involve further technological steps/features such as double epitaxial layer and double buried-layer diffusion, leading to an increase in the overall cost about 10%-20%. As noted, such a cost increase would be hardly acceptable in view of the small "weight" of a CAN transceiver in terms of silicon area (e.g., 5% or less) in a corresponding automotive System Based Chip—SBC.

Figure 3:
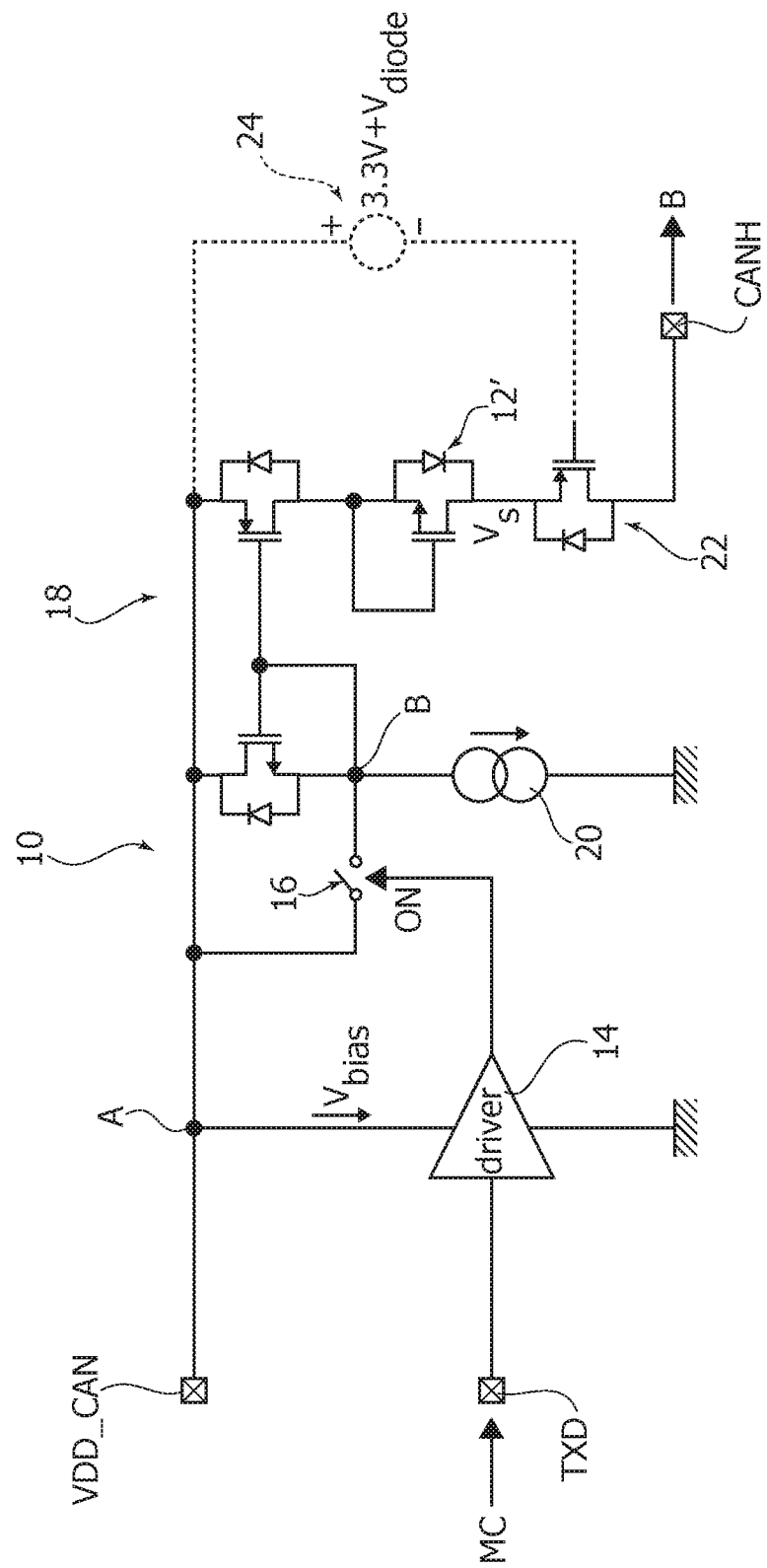
FIG. 3 is a circuit diagram exemplary of embodiments.

One or more embodiments may address these issues by resorting to an arrangement as exemplified (in general terms) in the circuit diagram of FIG. 3.

In FIG. 3, parts or elements like parts or elements already discussed in connection with the previous figures are indicated with like reference/numerals: a corresponding description will not be repeated here for brevity.

An arrangement as exemplified in FIG. 3 may be regarded as based on the concept of moving the HV diode between the (low voltage) current mirror 18 (e.g. P-channel) and the high voltage cascode exemplified by the (e.g., P-channel MOSFET) transistor 22, with the transistor 22 exemplary of a HV P-channel cascode element which cascodes the LV P-ch current mirror 18.

Such a concept is exemplified in FIG. 3 by denoting as 12' such a HV diode, which can be implemented as a MOSFET transistor such as 40V N-drift MOSFET with buried-layer in a diode configuration (gate shorted to the source).

Similar to the topology exemplified in FIG. 2, the gate voltage of the transistor 22 can depend on $V_{high}$ save that, in the case of FIG. 3, the voltage across the (notional) voltage generator 24 will now be equal to e.g. $3.3V+V_{diode}$, where $V_{diode}$ represents the voltage drop across the diode 12'.

It is noted that driving (the gate of) the transistor 22 with such a voltage generator 24 would provide—in normal operating conditions—the same driver behavior as in case of FIG. 2. However, in case of CANH shorted to +40V, the gate oxide voltage of the transistor 22 would be not limited within maximum allowable value (as established, e.g., for technology reasons, e.g., 3.6V) and the transistor 22 would be exposed to the risk of being damaged. So, an improved solution to drive the gate voltage of the transistor 22 is desirable.

It is otherwise noted that an arrangement as generally exemplified in FIG. 3 may ideally solve the issues discussed in the foregoing with the driver circuitry controlling the bus timings now supplied on a fixed rail (node A).

An issue may arise related to generating the gate voltage for the transistor 22: when the driver 10 is driven above VDD_CAN, the voltage Vgs (across the gate oxide) should desirably be limited (clamped) to a highest allowable value (technology-dependent), by sinking a small current in the recessive mode, while, in the dominant mode and during DOM←→REC transitions, higher input currents can be tolerated.

When CANH output node is driven above VDD_CAN, one or more embodiments may take into account the possible presence of a (very) low input current (e.g. about 4 μA on the CANH output node or pin) when the transceiver is in the recessive mode (REC) while in the dominant mode (DOM), and during mode transitions, the current can be (much) higher, e.g. up to 1.6 mA.

Operation of a circuit as exemplified in FIG. 3 is facilitated by driving the gate of the HV P-channel cascode (that is the transistor 22) by taking into account that the associated drive circuitry should desirably protect the HV P-channel cascode gate oxide (in fact a 45V P-channel MOSFET transistor is hardly able to withstand voltage of e.g. 45V between gate and source) by taking into account that a typical upper value for the operating Vgs voltage may be about 3.6V (which may be the case of devices using 70 Ångstrom gate oxide thicknesses) with similar constraints existing also for other technologies.

Also, protection should desirably act when the CANH output voltage is driven above VDD_CAN (this may be the cases for short-circuit conditions on the external wires) e.g. up to 40V with a reduced current sunk by the circuitry in order to avoid compromising the resistance (provided by the biasing circuitry) as measured on the CANH output pin or node.

Furthermore, in normal operating conditions (e.g., no short circuits on the output) the gate of the transistor 22 should desirably be driven at low impedance (e.g., at a voltage level equal to VDD_CAN–3.3V–$V_{diode}$, as before mentioned), providing currents up to e.g. 1.6 mA to the gate during DOM←→REC transitions so that distortion of output waveforms can be avoided.

Figure 4:
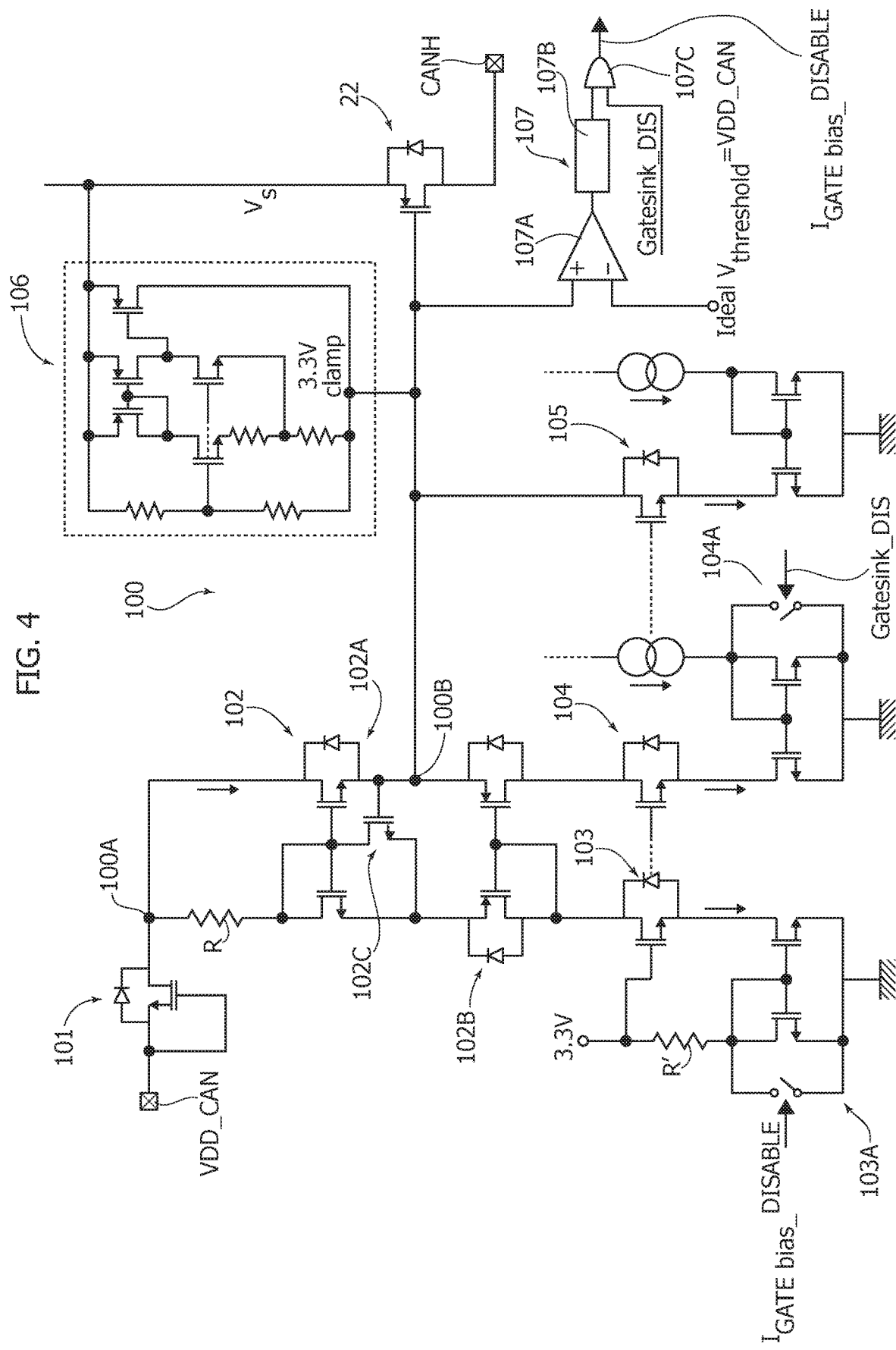
FIG. 4 is a detailed circuit diagram of embodiments.

One or more embodiments may address those issues by resorting to the circuit arrangement as exemplified in FIG. 4.

The circuit diagram of FIG. 4 provides a detailed example of circuitry (designated 100 as a whole) configured for providing a gate control of the transistor 22 (HV P-channel cascode) within the framework of circuit arrangement as exemplified in FIG. 3, while adopting a different approach in respect of the generator designated 24.

It is also observed that a topology as considered herein may be exposed to certain risks in terms of Direct Power Injection (DPI) robustness, e.g., when switching off the complete gate biasing structure.

For that reason, in FIG. 4, parts or elements like parts or elements already discussed in connection with the previous figures are indicated with like reference/numerals: a corresponding description will not be repeated here for brevity.

In the circuit diagram of FIG. 4, reference 101 denotes a diode arrangement comprising a MOSFET transistor in a diode arrangement (gate shorted to the source) in an arrangement substantially similar to one of the diode 12 (and 12') in FIG. 2 (and FIG. 3). For instance, the diode 101 in FIG. 4 may comprise a 40V N-drift MOSFET with the buried-layer scaled down in comparison with the homologous component designated 12 (and 12') in FIG. 2 (and 3) depending on the current drawn.

On the cathode of the diode 101 at node 100A a voltage equal to VDD_CAN−$V_{diode}$ is provided where $V_{diode}$ denotes the voltage drop across the diode 101.

Reference 102 indicates a pull-down network coupled to the node 100A and adopting a conventional AB output stage solution comprising a resistor R and a pull-down current generator using a pull-down current (e.g. 160 µA quiescent) to provide a drop of e.g. 3.3V from the cathode of the HV diode 101 and an output voltage at node 100B equal to VDD_CAN−$V_{diode}$−3.3V.

In one or more embodiments, the network in question may comprise two transistor pairs (e.g. MOSFET transistors) 102A, 102B with:

the transistors in each pair having their control terminals (gates, in the case of field effect transistors such as MOSFETs) mutually coupled;

a first transistor in each pair (left-hand side in FIG. 4) in a diode arrangement (gate shorted to the drain), with the current path through the diode-like transistors cascaded in a current line from the node 100A to a first pull-down current generator 103 (e.g., 160 µA) discussed previously; the intrinsic diode through the one of these transistors in the pair 102B is also shown;

the second transistors in each pair (right-hand side in FIG. 4) arranged with the current paths therethrough cascaded in a current line from the node 100A to a second pull-down generator 104 in a current line drawing the pull-down current (e.g., 320 µA) to be discussed later; the intrinsic diodes through these two latter transistors are also shown.

A still further transistor (e.g. a MOSFET transistor) 102C is shown having its current path extending between the common gates of the transistors in the pair 102A and the current line between the node 100A and the pull-down generator 103 at a point between the diode-coupled transistors in the pairs 102A, 102B for Safe Operating Area (SOA) protection.

As noted, reference 103 denotes as a whole pull-down current generator (to which a supply voltage of e.g. 3.3 V is applied) which sinks a current equal to e.g. 160 µA as given by, e.g., (3.3V−VgsN)/R' where R' denotes the resistance value of a resistor coupled to the 3.3 V supply and VgsN denotes the gate-source voltage drop across a transistor in a diode configuration (gate shorted to drain) in an e.g. N-ch current mirror between the resistor R' and ground. As discussed in the following, a switch 103A controlled by a signal $I_{GATEbias}$_DISABLE may be provided to short-circuit the source and the drain of this latter transistor.

As exemplified herein, the further pull-down current generator 104 produces a current with a value of, e.g., 1.6 mA to provide a current limit to the output voltage of the circuit section indicated 102, with this current limit corresponding to the highest current intensity the generator 104 can sink.

As discussed in the following, a switch 104A controlled by a signal Gatesink_DIS may be provided to short-circuit the source and the drain of a transistor in a diode configuration (gate shorted to drain) in an e.g. N-ch current mirror in the generator 104, to null the current mirror 104: when the switch 104A is activated, the circuit section 102 will practically sink no current and only the circuit section 105 (as discussed in the following) can sink current from output node 100B.

Reference 105 denotes a still further pull-down current generator. The generator 105 may be implemented like the pull-down current generators 103 and 104 as N-channel current mirrors providing a current to be drawn from the node 100B with, in the case of the generator 105, a (very) smaller value, e.g. 4 µA.

When the CANH output voltage is driven above VDD_CAN (e.g. up to about 8.3V) the current from the generator 105 can flow through a clamp circuit 106 (to be discussed later) from the source to the drain terminals of the transistor 22 (HV P-channel cascode) to the output terminal CANH.

The value of the current of the current generator 105 may be selected small enough to be negligible with respect to the current flowing through the input resistance of the biasing circuit of the CAN transceiver ($R_{in}$ as discussed in the introductory portion of the description in connection with FIG. 1).

Reference 106 in FIG. 4 denotes a clamp circuit active between the gate and source (Vgs-clamp circuit) of the output cascode transistor 22.

The clamp circuit 106 may be configured to drive a (very) small current when the value for Vgs is below a certain threshold (e.g. 3.3V, which may correspond to a normal condition in the absence of a short-circuit on the output voltage at the CANH node).

In one or more embodiments, the clamp circuit 106 may comprise any conventional clamp circuit arrangement, e.g. as shown in the figures. A clamp circuit is a two-terminal element ideally driving no current when the voltage applied is below a $V_{clamp}$ value and driving any current as soon as the voltage reaches $V_{clamp}$ value.

Briefly, a Zener diode clamping the Vgs voltage at a value of e.g. 3.3V to protect the gate oxide interface in the HV P-channel transistor 22 may be regarded as exemplary of a clamp circuit 106 adapted to be used in one or more embodiments.

Any circuit providing such a behavior may thus represent a suitable clamp for use in one or more embodiments with the capability of being configured in order to be able to drive a current high enough (e.g. up to 1.6 mA) to limit the voltage drop Vgs below a value of e.g. 3.6V.

Finally, reference 107 denotes an (optional) circuit section configured to switch off the pull-down current generator 103 by acting on the switch 103A via a signal $I_{GATEbias\_DISABLE}$ e.g. when the gate of the transistor 22 rises above VDD_CAN.

For instance, the circuit 107 may comprise an input comparator 107A sensitive to the signal on the gate of the transistor 22 (node 100B) and to an ideal reference threshold $V_{threshold}$ which may be set, e.g., to VDD_CAN.

In one or more embodiments the comparator 107A may provide a hysteresis behavior corresponding to the conditions:

$$V_{threshold} > \text{VDD\_CAN} - V_{diode} - V_{th\text{-}Nch}$$

$$V_{threshold} < \text{VDD\_CAN} - V_{diode} + V_{NwPw\text{-}Nch}.$$

where:

$V_{diode}$ is the voltage drop across the diode 101 coupled to VDD_CAN;

$V_{th\text{-}Nch}$ is the threshold voltage of N-channel pair 102A;

$V_{NwPw\text{-}Nch}$ is the voltage drop across the intrinsic diode shown at 102A.

The comparator 107 may be followed by an asymmetrical filter (T filter) 107B which, together with the comparator 107A may contribute to avoid unwanted assertion during Direct Power Injection (DPI).

The circuit 107 as exemplified herein also comprises an AND gate 107C so that issue of the signal $I_{GATEbias\_DISABLE}$ is gated by a signal Gatesink_DIS.

This digital signal can be generated (e.g., internally, under the control of MC) to be high only in recessive state, after DOM→REC transition is fully completed. So, this signal can be considered equal to TXD with rising edge, corresponding to DOM→REC transition, adequately delayed to provide a gate biasing function active in the DOM mode and during the REC→DOM transitions.

The same signal Gatesink_DIS may be applied to the disable switch 104A to disable the current generator 104 in the REC mode after DOM→REC transitions.

If the (optional) circuit 107 is not present, the current sunk from the CANH node in case of a short circuit up to e.g. 8.3V essentially corresponds to the current of the generator 105 and increases by adding to the current from the generator 103 when the voltage is higher than 8.3V, since in this condition (CANH above 8.3V) node 100A is pulled up to V(CANH)−Vclamp by the intrinsic diode at 102A (Vs=~V (CANH)).

If, conversely, the circuit 107 is present, the current sunk under the same conditions from the CANH node is kept equal to the current from the generator 105 for any value of the CANH voltage above VDD_CAN.

It will be appreciated that the pull-down current generator 104 may be kept active only in the DOM mode and during DOM←→REC transitions. In the recessive mode (REC) the generator 102 may provide a voltage to bias the gate of the cascode transistor 22 by sinking (only) the small current provided by the generator 105. This facilitates sinking a small current from the CANH node in those cases where the actual voltage V(CANH) at the node CANH is higher than VDD_CAN only in the recessive mode e.g. when measuring the CANH input resistance may be of interest.

An arrangement as exemplified in FIG. 4 facilitates addressing various issues underlying a topology as exemplified in FIG. 3.

A first issue is related to the possibility for the CANH voltage to rise up to, e.g., 40V. In that case the node Vs (that is, the source of the transistor 22) may rise to a corresponding voltage e.g. 40V−$V_{diode}$ and the voltage between the source and the gate of the transistor 22 may reach a high value with the risk of leading to the failure of the component.

That issue is addressed and solved by the clamp structure 106 which is configured to keep the gate-source voltage across the transistor 22 to safe values thus avoiding failure of the component.

Another issue may be related to facilitating operation of the circuit during the dominant (DOM) mode where the gate of the transistor 22 should desirably be driven in such a way to both source and sink a high current value (e.g. in the range of 1.6 mA) while limiting voltage spikes during transitions of the CANH output node while sustaining high voltage coupling effects.

That issue may be addressed by means of the class AB arrangement (essentially the generator 102 in cooperation with the generators 103, 104).

Still another issue may be related to providing a high-impedance structure during the recessive mode (REC) when the CANH node may rise to voltages up to 7V. In that case the right-hand side of the structure 102, 103, 104 (essentially the generator 104) can be turned off, via the switch 104A actuated by the Gatesink_DIS signal, thereby setting a high impedance mode while the generator 105 may be kept active to bias adequately the clamping structure 106. The current in that case may be limited to e.g. 4 µA to meet with the impedance specifications in so far as this low-value biasing current can be provided to the CANH node.

A still further issue may be related to facilitating efficient operation until the CANH voltage is lower than, say, 8V. In the case the CANH voltage is above that value, the intrinsic diode in the right-hand transistor in the pair 102A in the circuit section 102 is turned on and the current flowing in the left side of the circuit section 102 (as determined by the pull-down current generator 103, e.g. 160 µA) flows through that intrinsic diode, the $V_{gs}$ clamp, transistor 22 to CANH output node.

In an arrangement as exemplified herein, the possibility exists of turning off the current path through the intrinsic diode, nulling the pull-down current generator 103, via a disable signal $I_{GATEbias\_DISABLE}$ as produced by the circuit 107. Such a signal can be generated by detecting when the gate of the transistor 22 (as input to the comparator 107A) is above VDD_CAN. In that case the diode arrangement 101 is in a reverse mode while the intrinsic diode discussed above is in a forward condition.

FIGS. 5A-5B provide a comparative diagram exemplary of a possible behavior of the current (FIG. 5A)—ordinate in A) to voltage (FIG. 5B)—ordinate in V) characteristic of a CANH driver as exemplified in FIG. 4 in case all the biasing branches (that is the various current generators shown in FIG. 4) are kept always active, that is with the signal Gatesink_DIS not used and fixed e.g. to "0", with switch 104A kept open.

While possibly adequate for certain types of operations, such a solution could still be regarded as compromising the CANH input resistance.

FIGS. 6A-6B represents two diagrams indicative of the I-V characteristic of CAN driver as exemplified herein in case the gate sinking current structure (e.g., 104) is switched off in the recessive mode with the circuit 107 not comprised in the circuit (or disabled if comprised).

A behavior as exemplified in FIGS. 6A-6B can be regarded as an acceptable compromise to meet input resistance specifications (absolute values and matching) e.g. over a −2V to +7V CANH voltage range.

Figures 7A, 7B:
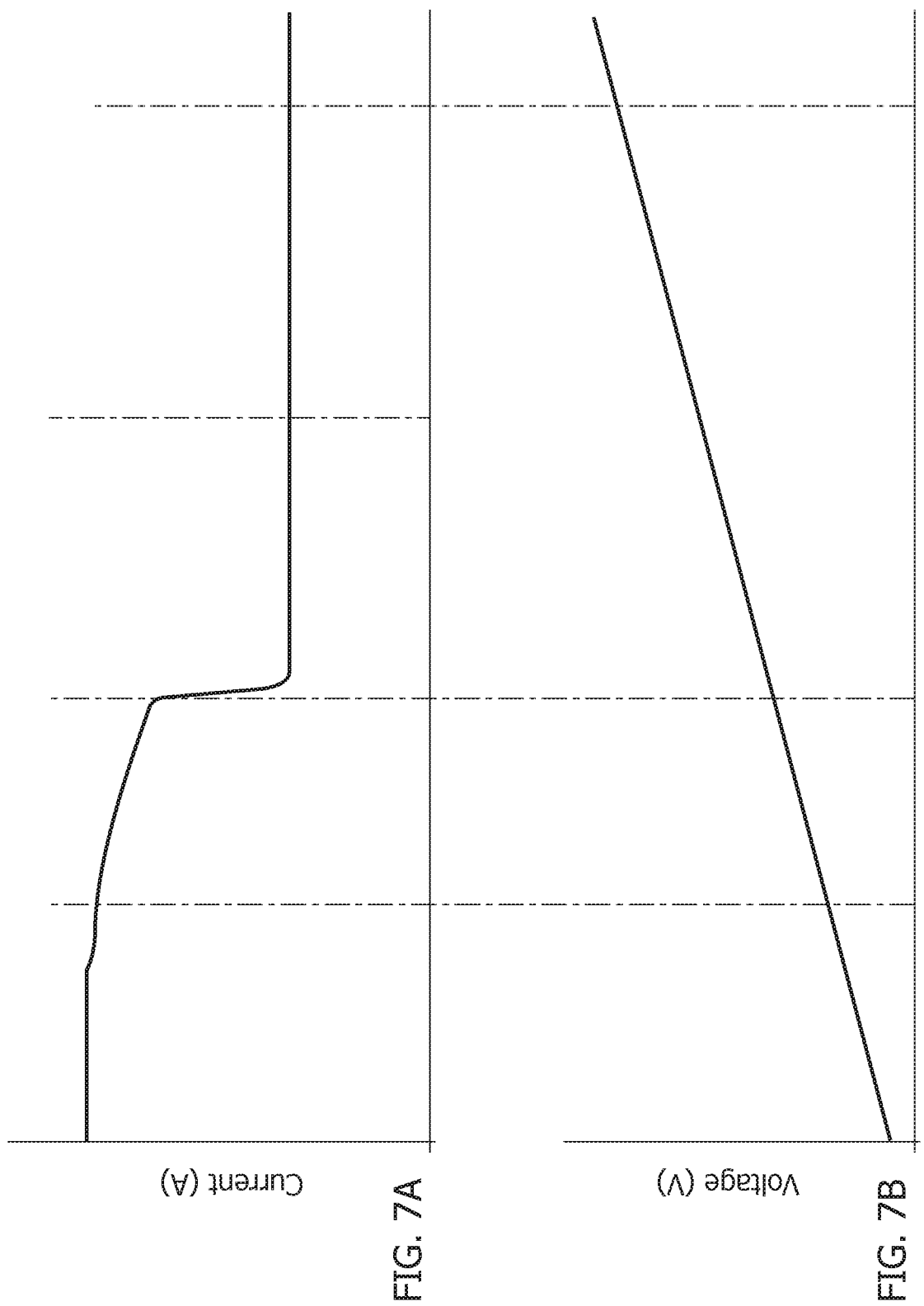

The diagrams of FIGS. 7A and 7B are exemplary of a possible I-V characteristic of a CANH driver as exemplified herein in the complete configuration with the circuit 107 comprised and enabled.

Such an arrangement is capable of meeting input resistance specifications (absolute values and matching) over a whole −12V to +12V CANH voltage range.

A circuit (e.g., 10) according to one or more embodiments may comprise:

a supply node (e.g., VDD_CAN) configured to receive a power supply, a control node (e.g., TXD) configured to receive a control signal with a first value and a second value (e.g., CANTX=0, CANTX=1), an output node (e.g., CANH) configured to provide a drive signal to a CAN bus (e.g., B) as a function of the control signal, an output transistor (e.g., 22) coupled to the output node to provide the CAN bus drive signal via the current path (e.g. source-drain, in the case of a field effect transistor such as a MOSFET) through the output transistor, a current mirror (18) in a current line from the supply node to the output node through the output transistor, the current line comprising an intermediate portion between the current mirror and the output transistor, wherein the current mirror is coupled (e.g., via 14, 16) to the control node, the current mirror configured to be switched, as a function of the control signal between:

a first (dominant) mode (or state), with the CAN bus drive signal applied to the output node via the output transistor (e.g., with the switch 16 non-conductive), and a second (recessive) mode (or state), with the output transistor providing a high output impedance at the output node (e.g., with the switch 16 conductive), wherein the circuit comprises a high-voltage diode (e.g., 12') arranged in the intermediate portion of the current line between the current mirror and the output transistor.

In one or more embodiments, the high-voltage diode may comprise a transistor in a diode-like arrangement with the control terminal (e.g. gate, in the case of a field effect transistor such as a MOSFET) coupled to the current path through the transistor.

In one or more embodiments, the high-voltage diode may be arranged with its anode towards the current mirror.

One or more embodiments may comprise a clamping circuit block (e.g., 106) active between the control terminal (e.g. gate, in the case of a field effect transistor such as a MOSFET) of the output transistor and the current path therethrough opposite the output node.

One or more embodiments may comprise a bias current generator (e.g., 105) coupled to the clamping circuit block to provide a bias current thereto.

One or more embodiments may comprise a class AB stage (e.g., 102, 103, 104) active between the supply node and the control terminal of the output transistor (e.g. via node 100B), the class AB stage configured to facilitate current flow through the output transistor in the first (dominant) mode.

In one or more embodiments, the class AB stage may comprise a first (e.g., 102A) and a second (e.g., 102B) pair of p-n junction devices (e.g. transistors, possibly in a diode-like configuration, left-hand side in FIG. 4), with respective transistors in the first and the second pairs (right-hand side in FIG. 4) having an intermediate node (e.g., 100B) therebetween coupled to the control terminal of the output transistor.

In one or more embodiments, the class AB stage may be coupled to first and second current lines from the supply node to ground, wherein:

the first current line may comprise a resistor (e.g., R) and a first pull-down current generator (e.g., 103) sinking from the supply node a first current with an intensity which is a function of the resistance value of the resistor, and the second current line may comprise a second pull-down current generator (e.g., 104) sinking from the output node (CANH, e.g., via the node 100B) a second current having an upper value thereby limiting the output current sunk by the class AB stage.

In one or more embodiments the respective transistors in the first and second pair may be arranged mutually cascaded in the second current line.

In one or more embodiments, the second pull-down current generator in the second current line may be selectively de-activatable (e.g., 104A; Gatesink_DIS) in the second, recessive mode after transitions from the dominant to the recessive mode.

One or more embodiments may comprise a sensor circuit block (e.g., 107) sensitive to the voltage at the control terminal of the output transistor, the sensor circuit block active (e.g., $I_{GATEbias\_DISABLE}$) on the first pull-down current generator to selectively de-activate the first pull-down current generator as a result of the voltage at the control terminal of the output transistor reaching an upper threshold value.

In one or more embodiments, the sensor circuit block may comprise:

at least one comparator stage (e.g., 107A), optionally with hysteresis, to compare the voltage at the control terminal of the output transistor with at least one reference threshold, and a gating component (e.g., 107C) coupling the sensor circuit block with the first pull-down current generator to facilitate disablement thereof in the second, recessive mode after the transition from the first, dominant mode to the second, recessive mode is (fully) completed.

A system according to one or more embodiments may comprise:

a CAN bus (e.g., B), and a driver circuit (e.g. 10) according to one or more embodiments having its output node coupled to the CAN bus, optionally at the high-side thereof, to provide the CAN bus drive signal thereto.

A method of operating a circuit or a system according one or more embodiments may comprise applying to the control node a control signal with a first value and a second value thereby producing operation of the circuit or system in:

a first, dominant mode, with the CAN bus drive signal applied to the output node via the output transistor (22), and a second, recessive mode, with the output transistor providing a high output impedance at the output node.

Without prejudice to the underlying principles, the details and embodiments may vary, even significantly, with respect to what has been described by way of example only without departing from the extent of protection.

The extent of protection is defined by the annexed claims.

What is claimed is:

1. A circuit, comprising:
a supply node configured to receive a power supply;
a control node configured to receive a control signal that switches between a first value and a second value;
an output node configured to provide a bus drive signal for a bus as a function of the control signal;
an output transistor having a current path coupled to the output node to provide the bus drive signal via the current path of the output transistor;
a switch having a current path coupled to the supply node and a control terminal coupled to the control node;
a current mirror comprising a first current mirror transistor having a current path coupled between the supply node and the switch, and a second current mirror transistor having a control terminal coupled to a control terminal of the first current mirror transistor and a current path coupled to the current path of the output transistor, wherein the current mirror is configured to be switched, as a function of the control signal between a first mode with the bus drive signal applied to the output node via the output transistor, and a second mode with the output transistor providing a high output impedance at the output node; and
a high-voltage diode having an anode coupled to the current path of the second current mirror transistor and a cathode coupled to the current path of the output transistor.

2. The circuit of claim 1, wherein the high-voltage diode comprises a transistor in a diode-like arrangement.

3. The circuit of claim 1, further comprising a clamping circuit block active between the control terminal of the output transistor and an intermediate node that is coupled between the current path of the output transistor and the cathode of the high-voltage diode.

4. The circuit of claim 3, further comprising a bias current generator coupled to the clamping circuit block to provide a bias current thereto.

5. A circuit, comprising:
a supply node configured to receive a power supply;
a control node configured to receive a control signal that switches between a first value and a second value;
an output node configured to provide a bus drive signal for a bus as a function of the control signal;
an output transistor having a current path coupled to the output node to provide the bus drive signal via the current path of the output transistor;
a switch having a current path coupled to the supply node and a control terminal coupled to the control node;
a current mirror comprising a first current mirror transistor having a current path coupled between the supply node and the switch, and a second current mirror transistor having a control terminal coupled to a control terminal of the first current mirror transistor and a current path coupled to the current path of the output transistor, wherein the current mirror is configured to be switched, as a function of the control signal between a first mode with the bus drive signal applied to the output node via the output transistor, and a second mode with the output transistor providing a high output impedance at the output node;
a class AB stage active between the supply node and a control terminal of the output transistor, the class AB stage configured to facilitate current flow through the output transistor in the first mode; and
a high-voltage diode having an anode coupled to the current path of the second current mirror transistor and a cathode coupled to the current path of the output transistor.

6. The circuit of claim 5, wherein the high-voltage diode comprises a transistor in a diode-like arrangement with a control terminal coupled to a current path through the transistor.

7. The circuit of claim 5, further comprising a clamping circuit block active between the control terminal of the output transistor and an intermediate node that is coupled between the current path of the output transistor and the cathode of the high-voltage diode.

8. The circuit of claim 7, further comprising a bias current generator coupled to the clamping circuit block to provide a bias current thereto.

9. The circuit of claim 5, wherein the class AB stage comprises a first and a second pair of p-n junction devices, wherein respective transistors in the first and the second pair have an intermediate node therebetween coupled to the control terminal of the output transistor.

10. The circuit of claim 5, wherein the class AB stage is coupled to first and second current lines from the supply node to ground;
wherein the first current line comprises a resistor and a first pull-down current generator configured to sink a first current from the supply node, the first current having an intensity that is a function of a resistance value of the resistor; and
wherein the second current line comprises a second pull-down current generator configured to sink a second current from the output node, the second current having an upper value thereby limiting the current sunk by the class AB stage.

11. The circuit of claim 10, wherein the class AB stage comprises a first and a second pair of p-n junction devices, wherein respective transistors in the first and the second pair have an intermediate node therebetween coupled to the control terminal of the output transistor.

12. The circuit of claim 11, wherein the respective transistors in the first and second pair are arranged mutually cascaded in the second current line.

13. The circuit of claim 10, wherein the second pull-down current generator in the second current line is selectively de-activatable in the second mode after transitions from the first to the second mode.

14. A circuit, comprising:
a supply node configured to receive a power supply;
a control node configured to receive a control signal that switches between a first value and a second value;
an output node configured to provide a drive signal for a CAN bus as a function of the control signal;
an output transistor coupled to the output node to provide the CAN bus drive signal via a current path of the output transistor;
a current mirror in a current line from the supply node to the output node through the output transistor, the current line comprising an intermediate portion between the current mirror and the output transistor, wherein the current mirror is coupled to the control node, wherein the current is mirror configured to be switched, as a function of the control signal between a first mode with the CAN bus drive signal applied to the output node via the output transistor, and a second mode with the output transistor providing a high output impedance at the output node;
a class AB stage active between the supply node and a control terminal of the output transistor, the class AB stage configured to facilitate current flow through the output transistor in the first mode;
a high-voltage diode arranged in the intermediate portion of the current line between the current mirror and the output transistor; and
a sensor circuit block, wherein the class AB stage is coupled to first and second current lines from the supply node to ground, wherein the first current line comprises a resistor and a first pull-down current generator configured to sink a first current from the supply node, the first current having an intensity that is a function of a resistance value of the resistor, wherein the second current line comprises a second pull-down current generator configured to sink a second current from the output node, the second current having an upper value thereby limiting the current sunk by the class AB stage, wherein the sensor circuit block is sensitive to a voltage at the control terminal of the output transistor, and wherein the sensor circuit block is active on the first pull-down current generator to selectively de-activate the first pull-down current generator as a result of the voltage at the control terminal of the output transistor reaching an upper threshold value.

15. The circuit of claim 14, wherein the sensor circuit block comprises:
a comparator stage configured to compare the voltage at the control terminal of the output transistor with a reference threshold; and
a gating component coupling the sensor circuit block with the first pull-down current generator to facilitate disablement thereof in the second mode after a transition from the first mode to the second mode is completed.

16. The circuit of claim 15, wherein the comparator stage comprises a comparator stage with hysteresis.

17. A system, comprising:
  a bus;
  a supply node configured to receive a power supply;
  a control node configured to receive a control signal that switches between a first value and a second value;
  an output node coupled to the bus to provide a bus drive signal that is a function of the control signal;
  an output transistor having a current path coupled to the output node to provide the bus drive signal via a current path of the output transistor;
  a switch having a current path coupled to the supply node and a control terminal coupled to the control node;
  a current mirror comprising a first current mirror transistor having a current path coupled between the supply node and the switch, and a second current mirror transistor having a control terminal coupled to a control terminal of the first current mirror transistor and a current path coupled to the current path of the output transistor, wherein the current mirror is configured to be switched, as a function of the control signal between a first mode with the bus drive signal applied to the output node via the output transistor, and a second mode with the output transistor providing a high output impedance at the output node; and
  a high-voltage diode having an anode coupled to the current path of the second current mirror transistor and a cathode coupled to the current path of the output transistor.

18. The system of claim 17, wherein the output node is coupled to a high-side of the bus to provide the bus drive signal thereto.

19. A method of operating the system according to claim 17, comprising applying the control signal to the control node thereby producing operation of the system in the first mode with the bus drive signal applied to the output node via the output transistor, and then the second mode with the output transistor providing a high output impedance at the output node.

20. The circuit of claim 1, further comprising:
  a first pull-down current generator configured to sink a first current from the supply node; and
  a sensor circuit block sensitive to a voltage at the control terminal of the output transistor and configured to selectively de-activate the first pull-down current generator based on the voltage at the control terminal of the output transistor.

21. The circuit of claim 1, wherein the bus is a CAN bus.
22. The circuit of claim 5, wherein the bus is a CAN bus.
23. The system of claim 17, wherein the bus is a CAN bus.

* * * * *